(12) United States Patent
Sumiyoshi (10) Patent No.: US 7,215,410 B2
(45) Date of Patent: May 8, 2007

(54) EXPOSURE APPARATUS

(75) Inventor: Yuhei Sumiyoshi, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 92 days.

(21) Appl. No.: 11/093,097

(22) Filed: Mar. 28, 2005

(65) Prior Publication Data
US 2005/0213066 A1 Sep. 29, 2005

(30) Foreign Application Priority Data
Mar. 29, 2004 (JP) ............... 2004-096429

(51) Int. Cl.
*G03B 27/52* (2006.01)
*G03B 27/42* (2006.01)
(52) U.S. Cl. ............... 355/55; 355/30; 355/53
(58) Field of Classification Search ......... 355/30, 355/52, 53, 55; 250/201.2, 548; 359/820
See application file for complete search history.

(56) References Cited
U.S. PATENT DOCUMENTS
6,878,916 B2* 4/2005 Schuster ............... 250/201.2
7,088,422 B2* 8/2006 Hakey et al. ............... 355/30
2005/0225737 A1* 10/2005 Weissenrieder et al. ...... 355/53

FOREIGN PATENT DOCUMENTS
JP          2005-19864 A    1/2005
WO          99/49504        9/1999

* cited by examiner

*Primary Examiner*—Henry Hung Nguyen
(74) *Attorney, Agent, or Firm*—Morgan & Finnegan LLP (57) ABSTRACT

An exposure apparatus includes a illumination optical system for illuminating a reticle with light from a light source, and a projection optical system for projecting a pattern of the reticle onto an object, said projection optical system includes a lens closest to the object, wherein a surface on the object side of the lens is smaller than an effective area of a surface on the reticle side of the lens, and wherein said exposure apparatus exposes the object via a liquid that is filled in a space between the lens and the object.

8 Claims, 10 Drawing Sheets

EXPOSURE APPARATUS

BACKGROUND OF THE INVENTION

The present invention relates generally to an exposure apparatus used to fabricate various device including semiconductor devices and liquid crystal display devices, and more particularly to an immersion type exposure apparatus for immersing the part of the projection optical system and the surface of the object in the liquid and exposing object through the liquid.

Along with the recent demands on minute fabrication, the improvement of resolution of the projection exposure apparatus has been increasingly required. The higher numerical aperture ("NA") of the projection optical system is effective to the improvement of the resolution, and the immersion exposure attracted people's attentions as one means that satisfies this demand. The immersion exposure exposes the object through the liquid that fills between the final surface of the projection optical system and the object, and promotes the higher numerical aperture and the resolution by using a medium that has a refractive index higher than the air's refractive index as the fluid. The immersion exposure proposes arranging a nozzle that supplies and recovers the liquid at near the final lens of the projection optical system, immerses the limited area between the final surface of the projection optical system and the object with the liquid, and circulates this. These nozzles are typically arranged along the outer diameter of the final lens of the projection optical system. See, for example, International Publication No. WO99/49504.

However, the prior art should form a channel that has the distance corresponding to the outer diameter of the final lens between the final lens and the object because the nozzle is arranged along the outer diameter of the final lens. The distance becomes long according to the enlargement of the outer diameter of the lens and the recent higher NA. Thereby, uniformly controlling the temperature and pressure of the liquid that flows into the channel has become difficult. The irregularity of the temperature and pressure of the liquid negatively affects the exposure light that passes there, and the high-quality exposure is difficult. On the other hand, throughput decreases if time is spent on the control of the temperature and pressure of the liquid. Moreover, the organic matters as the resist begins to melt from the object to the liquid, and the calcium fluoride ($CaF_2$) used widely as a material of the final lens similarly melts easily to the liquid. Therefore, the contamination of the liquid increases though the flesh liquid always circulates when the channel between the final lens and the object is long, and the deterioration and irregularity of transmittance are caused. The organic matter in the liquid adheres to the surface of the final lens, and the deterioration and irregularity of transmittance are caused. The deterioration and irregularity of transmittance negatively affects the exposure light that passes there, and the high-quality exposure becomes difficult.

BRIEF SUMMARY OF THE INVENTION

The present invention is directed to provide an immersion type exposure apparatus that achieves the high-quality exposure by facilitating the liquid control and decreasing the dissolution of impurities in the liquid.

An exposure apparatus of one aspect of the present invention includes a illumination optical system for illuminating a reticle with light from a light source, and a projection optical system for projecting a pattern of the reticle onto an object, said projection optical system includes a lens closest to the object, wherein a surface on the object side of the lens is smaller than an effective area of a surface on the reticle side of the lens, and wherein said exposure apparatus exposes the object via a liquid that is filled in a space between the lens and the object.

An exposure apparatus according to another aspect of the present invention that includes a projection optical system for projecting a pattern of a reticle onto an object, said projection optical system including a lens closest to the object, and a supply nozzle for supplying a liquid between the lens and the object, wherein a distance between a supply port of the supply nozzle and an optical axis of the projection optical system is less than ½ of an outer diameter of a surface on the reticle side of the lens, and wherein said exposure apparatus exposes the object via the liquid.

An exposure apparatus according to another aspect of the present invention that includes a projection optical system for projecting a pattern of a reticle onto an object, said projection optical system including a lens closest to the object, and a retaining member for retaining the lens, wherein a distance between the retaining member and an optical axis of the projection optical system is ½ or less of an effective diameter of a surface on the reticle side of the lens, and wherein said exposure apparatus exposes the object via a liquid that is filled in a space between the lens and the object.

An exposure apparatus according to another aspect of the present invention that includes a illumination optical system for illuminating a reticle with light from a light source, and a projection optical system for projecting a pattern of the reticle onto an object, said projection optical system includes a lens closest to the object, the lens includes a protective layer for preventing contact of the lens and a liquid that is filled in a space between the lens and the object, the protective layer is detachable from the lens, and a material of the protective layer does not dissolve more easily into the liquid than a material of the lens.

A device fabrication method according to another aspect of the present invention that includes the steps of exposing an object using an exposure apparatus, and performing a development process for the object exposed, wherein said exposure apparatus includes a projection optical system for projecting a pattern of a reticle onto the object, said projection optical system includes a lens closest to the object, wherein a surface on the object side of the lens is smaller than an effective area of a surface on the reticle side of the lens, and said exposure apparatus exposes the object via a liquid that is filled in a space between the lens and the object.

A device fabrication method according to another aspect of the present invention that includes the steps of exposing an object using an exposure apparatus, and performing a development process for the object exposed, wherein said exposure apparatus includes a projection optical system for projecting a pattern of a reticle onto the object, said projection optical system includes a lens closest to the object, the lens includes a protective layer for preventing contact of the lens and a liquid that is filled in a space between the lens and the object, the protective layer is detachable from the lens, and a material of the protective layer that does not dissolve more easily into the liquid than a material of the lens.

Other objects and further features of the present invention will become readily apparent from the following description of the preferred embodiments with reference to the accompanying drawings.

DETAILED DESCRIPTION OF THE PREFERRED EMBODIMENTS

Figure 1:
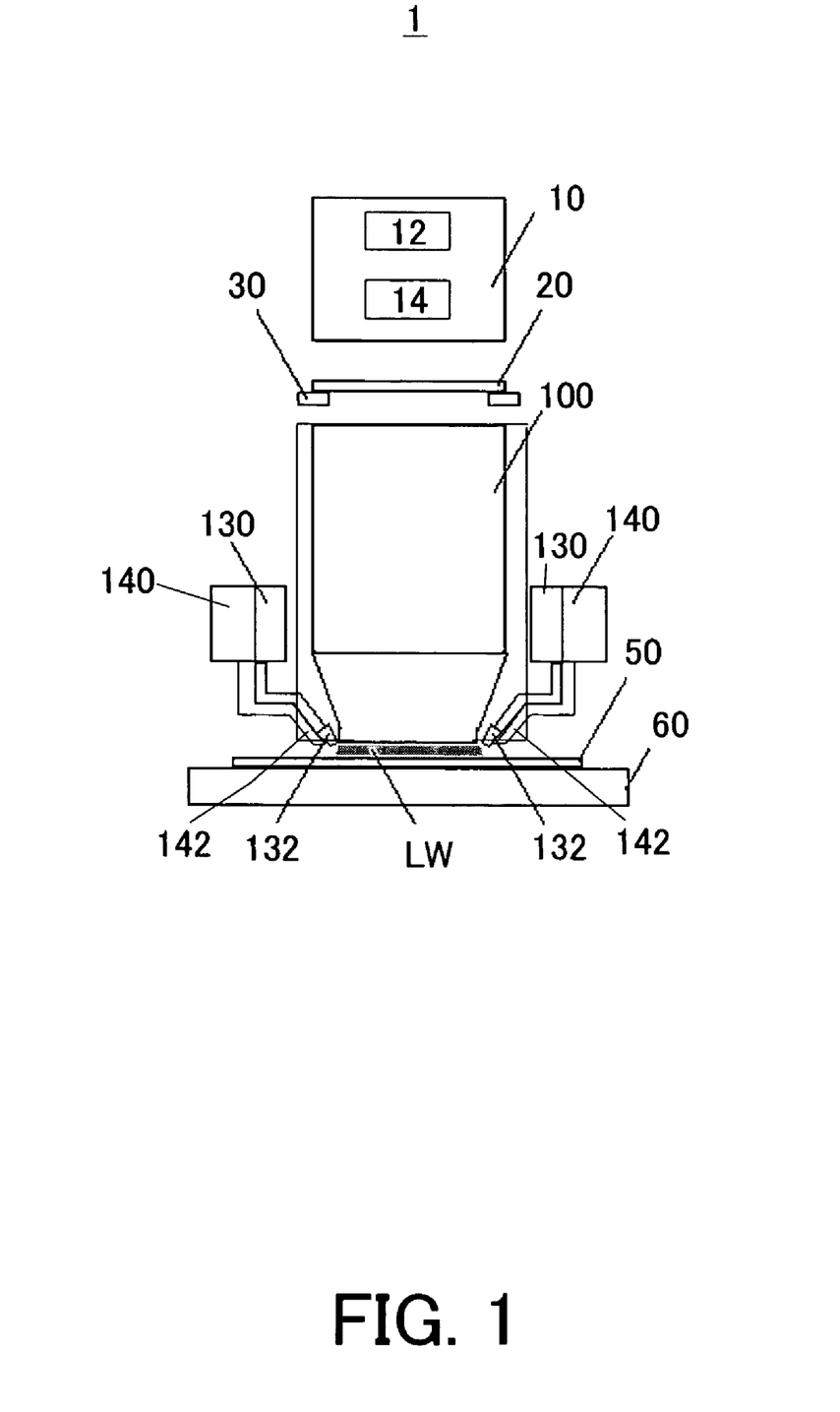
FIG. 1 is a schematic block diagram of an immersion type exposure apparatus.

A description will now be given of preferred embodiments of the present invention, with reference to the accompanying drawings. In each figure, the same reference numeral denotes the same element. Therefore, duplicate descriptions will be omitted. FIG. 1 is schematic block diagram of an immersion type exposure apparatus 1.

The immersion type exposure apparatus (Immersion lithography exposure system) 1 is an immersion type projection exposure apparatus that exposes onto an object 50 a circuit pattern created on a reticle (mask) 20 via a liquid LW supplied a part between a final surface at the object 50 side of a projection optical system 100 and the object 50 at least, e.g., in a step-and-repeat or a step-and-scan manner. This embodiment exemplarily describes a step-and-scan immersion type exposure apparatus (which is also called "a scanner"). The "step-and-scan manner", as used herein, is an exposure method that exposes a reticle pattern onto a wafer by continuously scanning the wafer relative to the reticle, and by moving, after an exposure shot, the wafer stepwise to the next exposure area to be shot. The "step-and-repeat manner" is another mode of exposure method that moves a wafer stepwise to an exposure area for the next shot, for every cell projection shot.

The immersion type exposure apparatus 1 includes, as shown in FIG. 1, an illumination apparatus 10, a reticle stage 30 that mounts the reticle 20, the projection optical system 100, a wafer stage 60 that mounts the object 50.

The illumination apparatus 10 illuminates the reticle 20, on which a circuit pattern to be transferred is formed, and includes a light source part 12 and an illumination optical system 14.

The light source part 12 uses, as an example, a light source such as ArF excimer laser with a wavelength of approximately 193 [nm] and KrF excimer laser with a wavelength of approximately 248 [nm]. However, the laser type is not limited to excimer lasers because for example, $F_2$ laser with a wavelength of approximately 157 [nm] may be used. Similarly, the number of laser units is not limited. For example, two independently acting solid lasers would cause no coherence between these solid lasers and significantly reduce speckles resulting from the coherence. An optical system for reducing speckles may swing linearly or rotationally. When the light source part 12 uses laser, it is desirable to employ a beam shaping optical system that shapes a parallel beam from a laser source to a desired beam shape, and an incoherently turning optical system that turns a coherent laser beam into an incoherent one. A light source applicable for the light source part 12 is not limited to a laser, and may use one or more lamps such as a mercury lamp and a xenon lamp.

The illumination optical system 14 is an optical system that illuminates the reticle 20 using the light from the light source part 12, and includes a lens, a mirror, a light integrator, a stop, and the like, for example, a condenser lens, a fly-eye lens, an aperture stop, a condenser lens, a slit, and an image-forming optical system in this order. The illumination optical system 14 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive element.

The reticle 20 is made, for example, of quartz, forms a circuit pattern to be transferred, and is supported and driven by a reticle stage 30. Diffracted light emitted from the reticle 20 passes through the projection optical system 100 and is then projected onto the object 50. The reticle 20 and the object 50 are located in an optically conjugate relationship. Since the immersion type exposure apparatus 1 is a scanner, the reticle 20 and the object 50 are scanned at the speed ratio of the reduction rate of the projection optical system 100, thus transferring the pattern from the reticle 20 to the object 50. If it is a step-and-repeat immersion type exposure apparatus (referred to as a "stepper"), the reticle 20 and the object 50 remains still when exposing the reticle pattern.

The reticle stage 30 supports the reticle 20 via a reticle chuck (not shown), and is connected to a moving mechanism (not shown). The moving mechanism includes a linear motor, etc., and moves the reticle 20 by driving the reticle stage 30 in a direction X, a direction Y, a direction Z, and a direction of rotation of each axis. Here, X is a scan direction on the reticle 20 or the object 50, Y is a direction perpendicular to it, and Z is a perpendicular direction to the surface of reticle 20 or the object 50.

The projection optical system 100 serves to image the diffracted light that has generated by the patterns formed on the reticle 20 onto the object 50. The projection optical system 100 may use an optical system comprising solely of a plurality of lens elements, an optical system including a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may be accomplished by using a plurality of lens units made from glass materials having different dispersion values (Abbe values) or arranging a diffractive optical element such that it disperses light in a direction opposite to that of the lens unit.

The object 50, such as a wafer and a LCD, is an exemplary object to be exposed. Photoresist is applied to the object 50.

The wafer stage 60 supports the object 50 via a wafer chuck (not shown). The wafer stage 60 moves the object 50 in the direction X, the direction Y, the direction Z, and the direction of rotation of each axis by using a linear motor as well as the reticle stage 30. The positions of the reticle stage 30 and the wafer stage 60 are monitored, for example, by a laser interferometer and the like, so that both are driven at a constant speed ratio. The wafer stage 60 is installed on a stage stool supported on the floor and the like, for example, via a damper. The reticle stage 30 and the projection optical system 100 are installed on a lens barrel stool (not shown) support, for example, via a damper, to the base frame placed on the floor.

A liquid supply mechanism 130 includes a supply nozzle 132, and supplies the liquid LW between the projection optical system 100 and the object 50. The liquid supply mechanism 130 includes, for example, a tank that collects the liquid LW, a compressor that flows the liquid LW, and a flow rate controller that controls a supply flow rate of the liquid LW. Moreover, the liquid supply mechanism 130 is desirable when it includes a temperature controller to control a supply temperature of the liquid LW. It explains the supply nozzle 132 in detail with a lens barrel 120 described later.

A liquid recovery mechanism 140 includes a recovery nozzle 142, and recovers the liquid LW that supplied between the final lens 110 and the object 50 via the recovery nozzle 142. The liquid recovery mechanism 140 includes, for example, a tank that temporarily collects the recovered liquid LW, a suction apparatus that absorbs the liquid LW, a flow rate controller that controls a recovery flow rate of the liquid LW. It explains the recovery nozzle 142 in detail with the lens barrel 120 described later.

The arrangement of the liquid supply mechanism 130 and the liquid recovery mechanism 140 is an exemplification, and each position is changeable.

The liquid LW is selected from a material with a little absorption of the exposure light, moreover, has an almost same refractive index as refraction system optical element such as quartz and the calcium fluorides. Concretely, the liquid LW for the immersion is pure water, function water, organic liquid, and liquid fluorides (for example, fluorocarbon). It is desirable to deaerate the liquid LW to remove dissolved gas enough by a deaerator beforehand. This is because the deaerator suppresses the generation of the air bubbles, and absorbs the air bubbles into the liquid immediately even if the air bubbles are generated. For example, nitrogen and the oxygen contained in an atmosphere are targeted, if 80% or more of the dissolvable gas amount is dissolved into the liquid, the generation of the air bubbles can be suppressed enough. The immersion type exposure apparatus 1 may be provided with the deaerator, and supply the liquid LW to the liquid supply mechanism 130 while always removing the dissolved gas of the liquid LW. For example, a vacuum deaerator that flows the liquid into one side separated by a gas transmission film, makes the other side vacuum, and drives out the dissolved gas of the liquid in the vacuum through the film is suitable as the deaerator.

Figure 2:
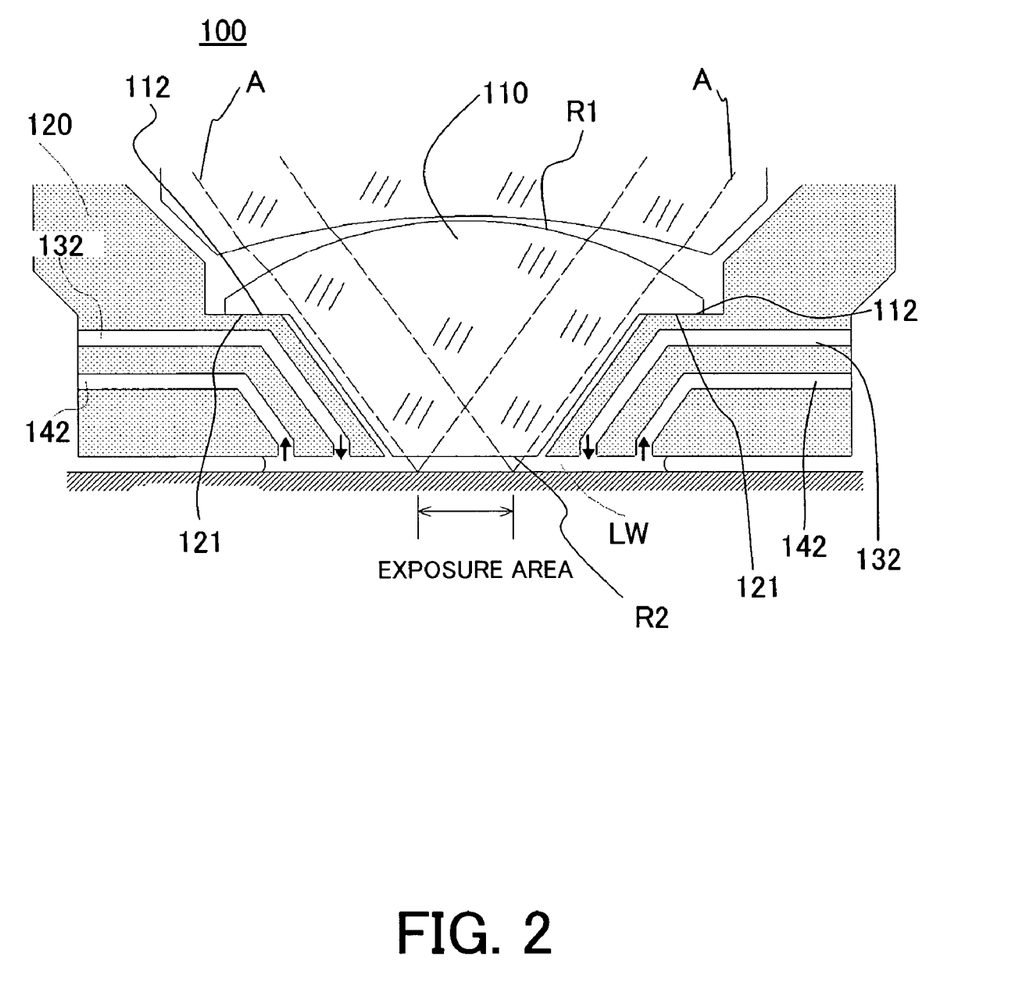
FIG. 2 is a schematic partially sectional view of an object side of a projection optical system used for the immersion type exposure apparatus shown in FIG. 1.

Referring to FIG. 2, a detail description will be given the projection optical system 100 used for the immersion type exposure apparatus 1 of the present embodiment. Here, FIG. 2 is a partially sectional view of the object 50 side of the projection optical system 100. The projection optical system 100 includes, as above-mentioned, the plural optical element (not shown) and the lens barrel 120 that supports the optical element.

The plural optical element of the projection optical system 100 projects the incidence light of the projection optical system 100 onto the object 50. In the instant embodiment, the plural optical element is lens, and the lens arranged at most object 50 side is called the final lens 110.

The final lens 110 includes a first surface R1 of the reticle 20 side and a second surface R2 of the object side. The final lens 110 has, as shown FIG. 3A, a sectional shape of almost a circular truncated cone shape, and is formed a retaining member 112 that is retained in the lens barrel 120 at an upper part. A distance from the first surface R1 of the final lens 110, in other words, a thickness of the retaining member 112 may be about 5 mm or more to have enough strength with the final lens 110.

Figure 3A:
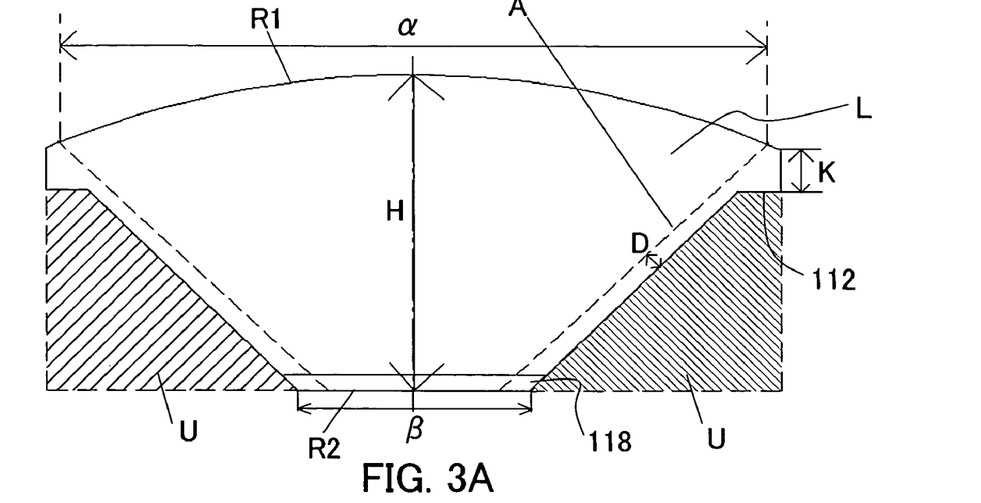
FIG. 3 is a schematic sectional view of a final lens used for the projection optical system shown in FIG. 2.
Figure 3B:
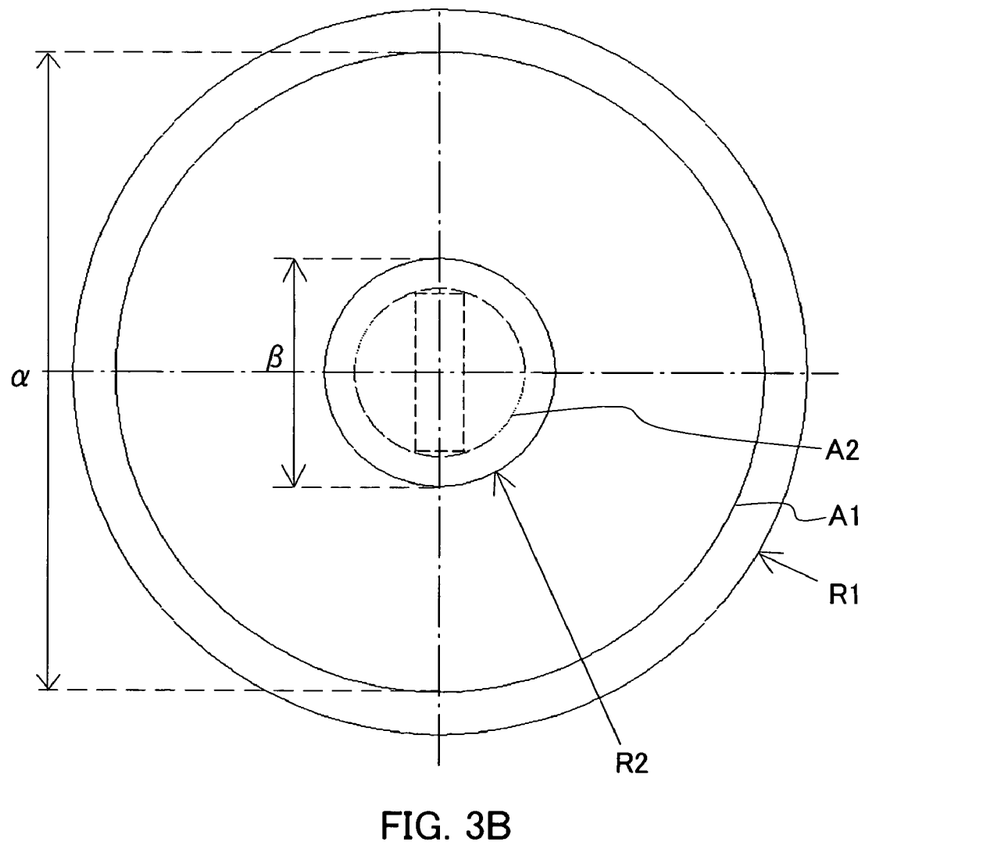

The final lens 110 has the center thickness H of 10 mm or more, as shown FIG. 3B, and the outer diameter B of the second surface R2 is smaller that an effective diameter a of the first surface R1 (the second surface R2 of the final lens 110 is smaller than the effective area of the first surface R1). In the instant embodiment, the outer diameter B of the second surface R2 is ½ or less of the effective diameter a of the first surface R1, and the area of the second surface is ¼ or less of the area of the first surface R1. Therefore, a contact area of the second surface R2 of the final lens 110 and liquid LW is suppressed to less than 25% compared with the conventional lens as which the outer diameter of the first surface R1 and the outer diameter B of the second surface R2 are almost the same, substantially, the amounts of impurities that begin to dissolve from the final lens 110 can be suppressed to 75% or more. As a result, the high-quality exposure can be achieved by preventing the deterioration and irregularity of transmittance. Here, "the effective diameter" is an incidence area (effective area) of the light of maximum NA of the project optical system. In FIG. 3, A1 is the effective area of the first surface R1, and A2 is the effective area of the second surface R2.

The final lens 110 is formed to an external shape that has the interval D of 2 mm or more from the effective diameter A because forming the shape that the maximum NA light of the incidence light of the projection optical system 100 is not blocked. If the interval D is 2 mm or less, the distortion is given to the final lens 110 when the lens is processed, and the distortion is cause of damaging the birefringence and refractive index homogeneity etc. of the light. Here, FIG. 3A is a sectional view of the final lens 110 of the projection optical system 100, and FIG. 3B is a plane view of the final lens 110 of the projection optical system 100. A broken line shown in FIG. 2 is the optical path of the maximum NA light of incidence light of the projection optical system 100.

In the instant embodiment, the center thickness of the final lens 110 is 51.3 mm, the curvature radius of R1 is 164.4 mm, the effective diameter of R1 is f116.4 mm, R2 is the flat surface, and the effective diameter of R2 is f28.4 mm.

The final lens 110 is characterized in the retaining member 112 formed at the upper part (in other words, the reticle 20 side) and has the almost circular truncated cone shape. The sectional shape of the conventional final lens has, generally, almost rectangle shape, the contact area with the liquid LW is large by an unnecessary part (in other words, non-incidence part of the maximum NA light) U and impurities etc. begin easily to dissolve from the final lens. On the other hand, the final lens 110 of the present embodiment suppresses the contact area with the liquid LW by the almost circular truncated cone shape, and can suppress the dissolution of impurities. As a result, the high-quality exposure can be achieved by preventing the deterioration and irregularity of transmittance. Cutting the unnecessary part U of the final lens 110 is the method of diagonal cutting along the light ray and the method of cutting to shape suitable to arrange the liquid supply mechanism 130 and liquid recovery mechanism 140 described later. The former has the merit of the part processing easily comparatively easy shape, and the latter has the merit of arranging easily the entire surrounding system including the lens barrel 120.

The final lens 110 uses the calcium fluoride ($CaF_2$) as a material from the viewpoint of durability. However, because the calcium fluoride melts easily to the liquid, a protective layer 118 that consists of the material that does not dissolve more easily than the calcium fluoride is formed in the second surface R2 of the final lens 110.

The protective layer 118 prevents the contact of the final lens 110 and the liquid LW, for example, is formed with quartz that has the thickness of about 5 mm to 10 mm. The protective layer 118 is detachable from the final lens 110, for example, is pasted on the second surface R2 of the final lens 110 by using the wafer tension. The final lens 110 decreases the dissolution of the final lens 110 and the impurities that begin to dissolve from the lens by installing the protective layer 118, and prevents the contamination of the liquid LW. As a result, the high-quality exposure can be achieved by preventing the deterioration and irregularity of transmittance.

The lens barrel 120 protects, and retains the lens unit. The lens barrel 120 includes, as shown in FIG. 2, a retaining member 121, a supply channel (the supply nozzle) 132 of the liquid supply mechanism 130, and a recovery channel (recovery nozzle) 142 of the liquid recovery mechanism 140. The lens barrel 120 of the instant embodiment has a structure that unites the supply channel 132 of the liquid supply mechanism 130 and the recovery channel 142 of the liquid recovery mechanism 140, and the retaining member 121 to retain the final lens 110 is formed at the upper part of the supply channel 132.

The retaining member 121 retains the final lens 110. The retaining member 121 depends on the shape of the retaining member 112 of the final lens 110. For example, as shown FIG. 3B, if the retaining member 112 of the final lens 110 is circle shape, the retaining member 121 is arranged in the circle. In this case, even if it is not necessary to arrange the retaining member 121 continuously, and the retaining member 121 retains the final lens 110 in plural points.

Figure 4:
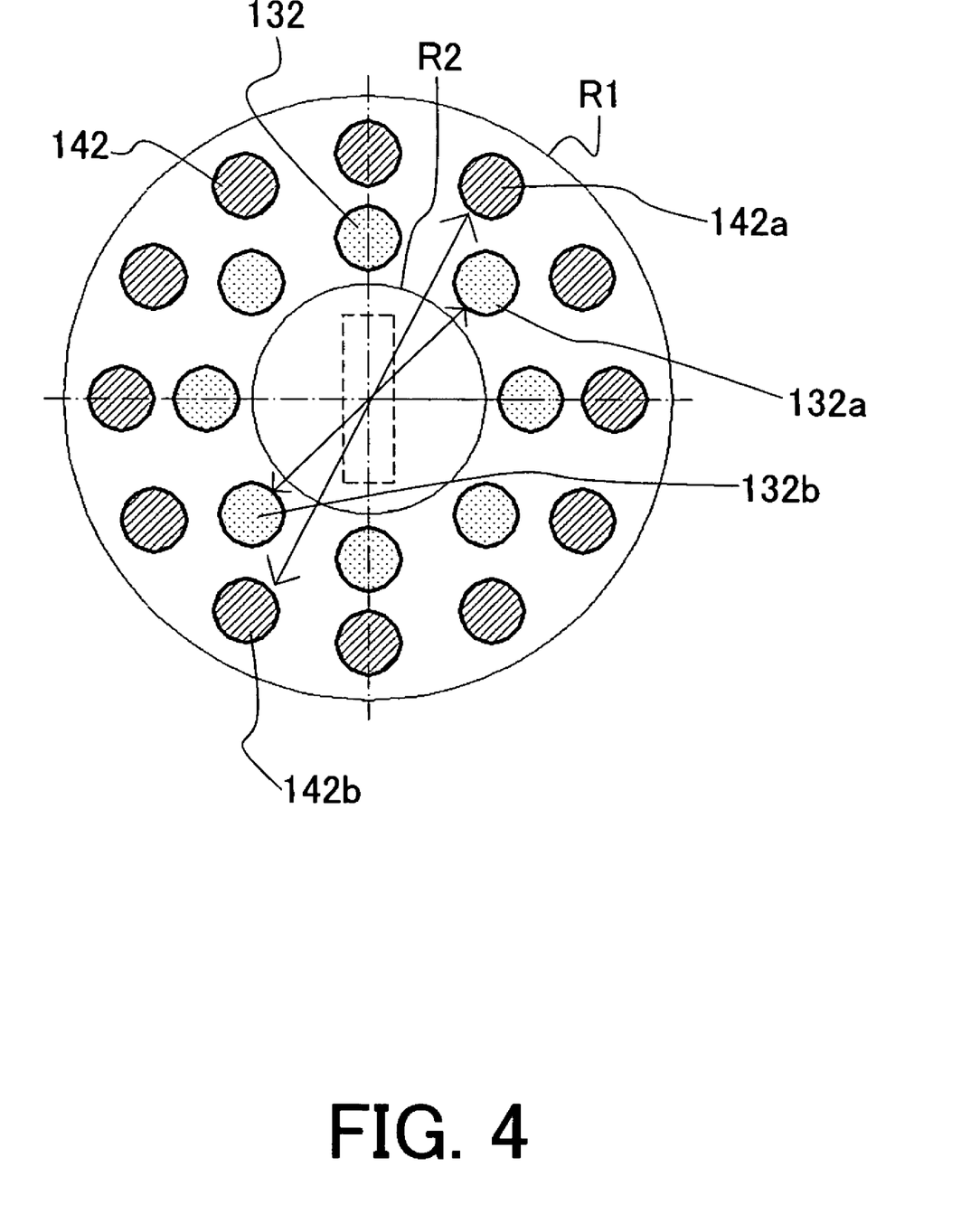
FIG. 4 is a schematic bottom view of an arrangement relation between the final lens of the projection optical system shown in FIG. 2 and a supply nozzle and recovery nozzle.

The supply nozzle 132 projects into the first surface R1 of the final lens 110 when the final lens 110 is seen from the reticle 20 side. The distance between the supply port of the supply nozzle 132 and the optical axis of the projection optical system 100 is less than ½ of the outer diameter of the first surface R1 of the final lens 110 (the distance of the supply port of the supply nozzle 132 and the optical axis of the projection optical system 100 may be ½ or less of the effective diameter of the first surface R1 of the final lens 110). This is because the final lens 110 is almost a circular truncated cone shape, the supply nozzle 132 can project along the shape of the final lens 110. Therefore, as shown in FIG. 4, for example, the distance between the supply nozzle 132a and the supply nozzle 132b opposed to the supply nozzle 132a can be shortened more than the final lens of the column shape. Thereby, the liquid supply mechanism 130 is controlling the flow of the liquid LW easily, and reduces the flow rate of the liquid LW. As a result, because uniformly controlling the temperature and the pressure of the liquid LW that flows in the supply nozzle 132 is easier than the conventional, the immersion type exposure apparatus 1 enables the high-quality exposure. Because the immersion type exposure apparatus 1 can shorten the control time of the temperature and the pressure of the liquid LW, throughput can be improved. Here, FIG. 4 is a bottom view of an arrangement relation between the final lens 110 of the projection optical system 100 and the supply nozzle 132 and recovery nozzle 142.

The recovery nozzle 142 projects to the first surface R1 inside of the final lens 110 when the final lens 110 is seen from the reticle 20 side as well as the supply nozzle 132. The distance between the recovery port of the recovery nozzle 142 and the optical axis of the projection optical system 100 is less than ½ of outer diameter of the first surface R1 of the final lens 110 (the distance between the recovery port of the recovery nozzle 142 and the optical axis of the projection optical system 100 may be ½ or less of the effective diameter of the first surface R1 of the final lens 110). Therefore, as shown in FIG. 4, for example, the distance between the recovery nozzle 142a and the recovery nozzle 142b opposed to the recovery nozzle 142a can be shortened more than the final lens of the column shape. Thereby, the liquid recovery mechanism 140 controls the flow of the liquid LW easily, is also reduces the flow rate of the liquid LW. As a result, because uniformly controlling the temperature and the pressure of the liquid LW is easier than the conventional, the immersion type exposure apparatus 1 enables the high-quality exposure. Moreover, because the immersion type exposure apparatus 1 can shorten the control time of the temperature and the pressure of the liquid LW, throughput can be improved. The recovery nozzle 142 may recover the liquid LW by using the effect of the surface tension of the liquid LW.

Figure 5A:
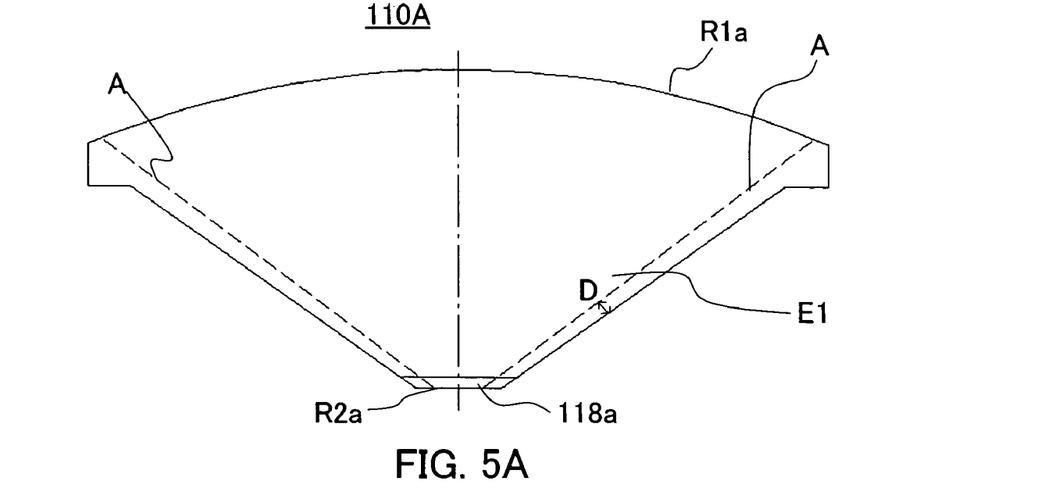
FIG. 5 is a schematic sectional view of a final lens of another embodiment used for the projection optical system shown in FIG. 2.

Next, referring to FIG. 5, a detail description will be given a final lens 110A that is another embodiment of the final lens 110. Here, FIG. 5A is a sectional view of the final lens 110A of the projection optical system 100, and FIG. 5B is a plane view of the final lens 110A of the projection optical system 100.

Figure 5B:
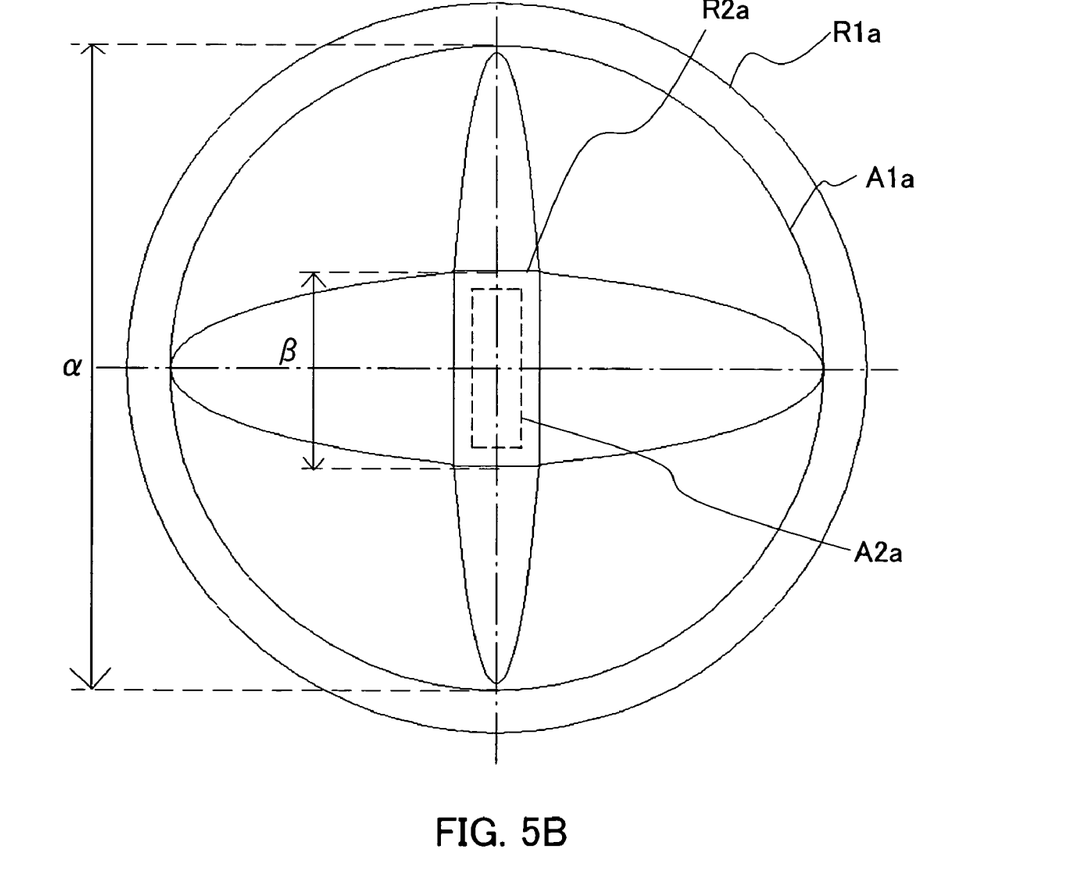

The external shape of a second surface R2a of the final lens 110A is, shown in FIG. 5B, not circular but more rectangular compared with the final lens 110. The final lens 110A is formed to external shape that has the interval D of 2 mm or more from the effective diameter A as well as the final lens 110. As above-mentioned, if the interval D is 2 mm or less, the distortion is created in the final lens 110 when the lens is processed, and the distortion is the cause of damaging the birefringence and refractive index homogeneity etc. of the light.

The final lens 110A suppresses the contact area with the liquid LW because the second surface R2a is smaller than the conventional final lens. Therefore, the final lens 110A decreases impurities that begin to dissolve into the liquid LW, and can prevent the contamination of the liquid LW. As a result, the high-quality exposure can be achieved by preventing the deterioration and irregularity of transmittance. In the instant embodiment, the outer diameter B of the second surface R2a is ½ or less of the conventional. Therefore, a contact area with the liquid LW is suppressed to 25%, and impurities of 75% or more beginning to melt can be suppressed to substantial.

The final lens 110A has the protective layer 118 that does not dissolve more easily than the calcium fluoride, and prevents contact with the liquid LW at the second surface R2a of the final lens 110A as well as the final lens 110.

Figure 6:
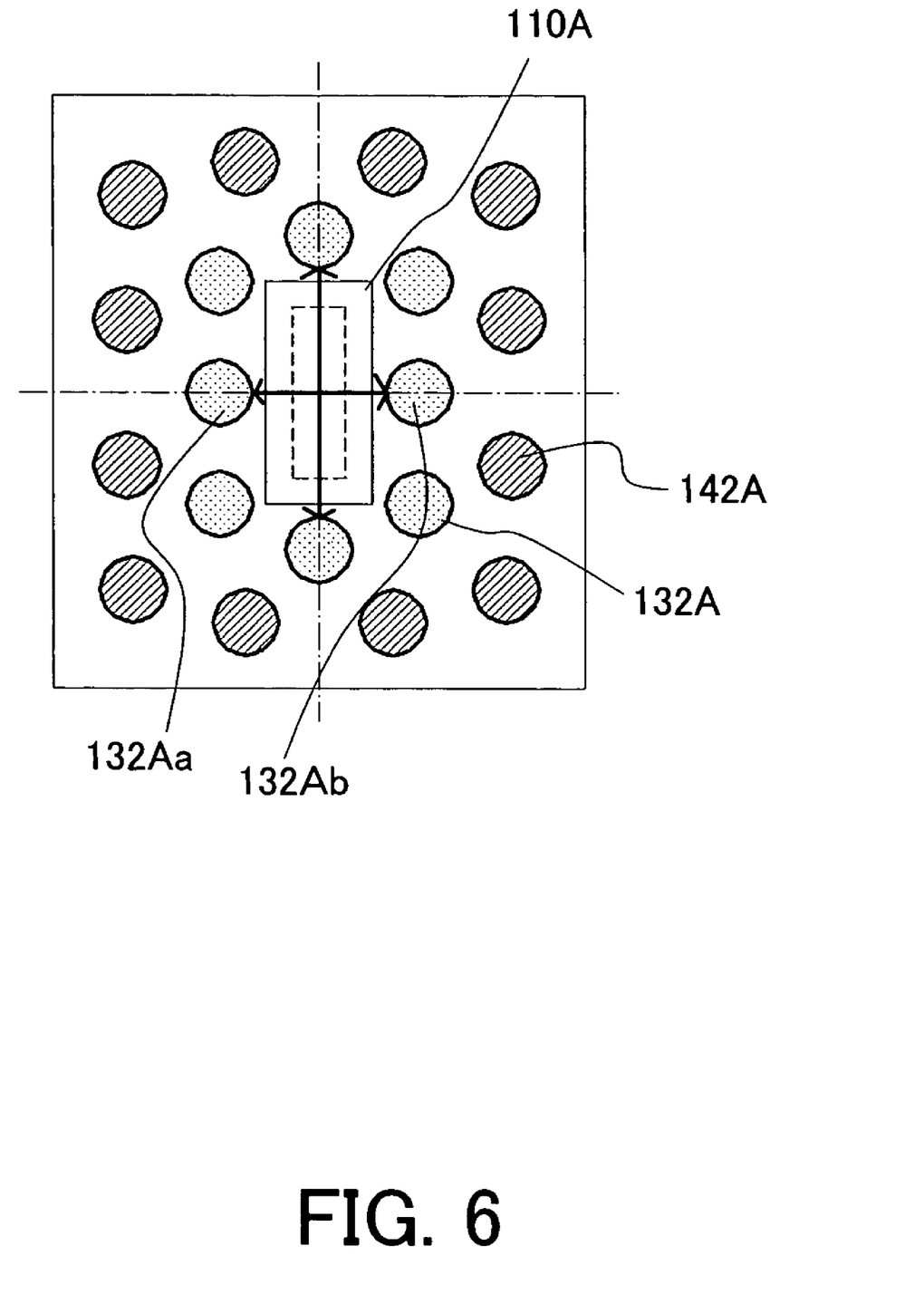
FIG. 6 is a schematic bottom view of an arrangement relation between the final lens of another embodiment of the projection optical system shown in FIG. 2 and a supply nozzle and recovery nozzle.

Referring to FIG. 6, a description will be given of an arrangement of the supply nozzle 132 and the recovery nozzle 142 when the final lens 110A is used. FIG. 6 is a bottom view of the arrangement of the final lens 110A of the projection optical system 100 and the supply nozzle 132A and recovery nozzle 142A.

The supply nozzle 132A is arranged along the second surface R2a of the final lens 110A. Therefore, the distance between the supply nozzle 132Aa and the supply nozzle 132Ab opposed to the supply nozzle 132Aa can be shortened more than the final lens of the column shape. Thereby, the liquid supply mechanism 130 controls the flow of the liquid LW easily, and reduces the flow rate of the liquid LW. As a result, because uniformly controlling the temperature and the pressure of the liquid LW that flows in the channel is easier than the conventional, the immersion type exposure apparatus 1 enables the high-quality exposure. Moreover, because the immersion type exposure apparatus 1 can shorten the control time of the temperature and the pressure of the liquid LW, throughput can be improved.

The recovery nozzle 142A is arranged along the second surface R2a of the final lens 110A. Therefore, the distance between the recovery nozzle 142Aa and the recovery nozzle 142Ab opposed to the recovery nozzle 142Aa can be shortened more than the final lens of the column shape. Thereby, the liquid recovery mechanism 140A controls the flow of the liquid LW easily, and reduces the flow rate of the liquid LW. As a result, because uniformly controlling the temperature and the pressure of the liquid LW that flows in channel is easier than the conventional, the immersion type exposure apparatus 1 enables the high-quality exposure. Moreover, because the immersion type exposure apparatus 1 can shorten the control time of the temperature and the pressure of the liquid LW, throughput can be improved.

Generally, the exposure apparatus of a step-and-scan manner exposes one shot by scanning on the wafer in a slit exposure area, so the wafer stage inevitably increases to a case scanned in vertical direction of length in the slit for the projection optical system 100. For that case, because the efficiency of the immersion improves by arranging many of the supply nozzles 132A and the recovery nozzles 142A that exist in the frequently scanning direction in view of the slit, the final lens 110A is suitable shape for it.

Figure 7:
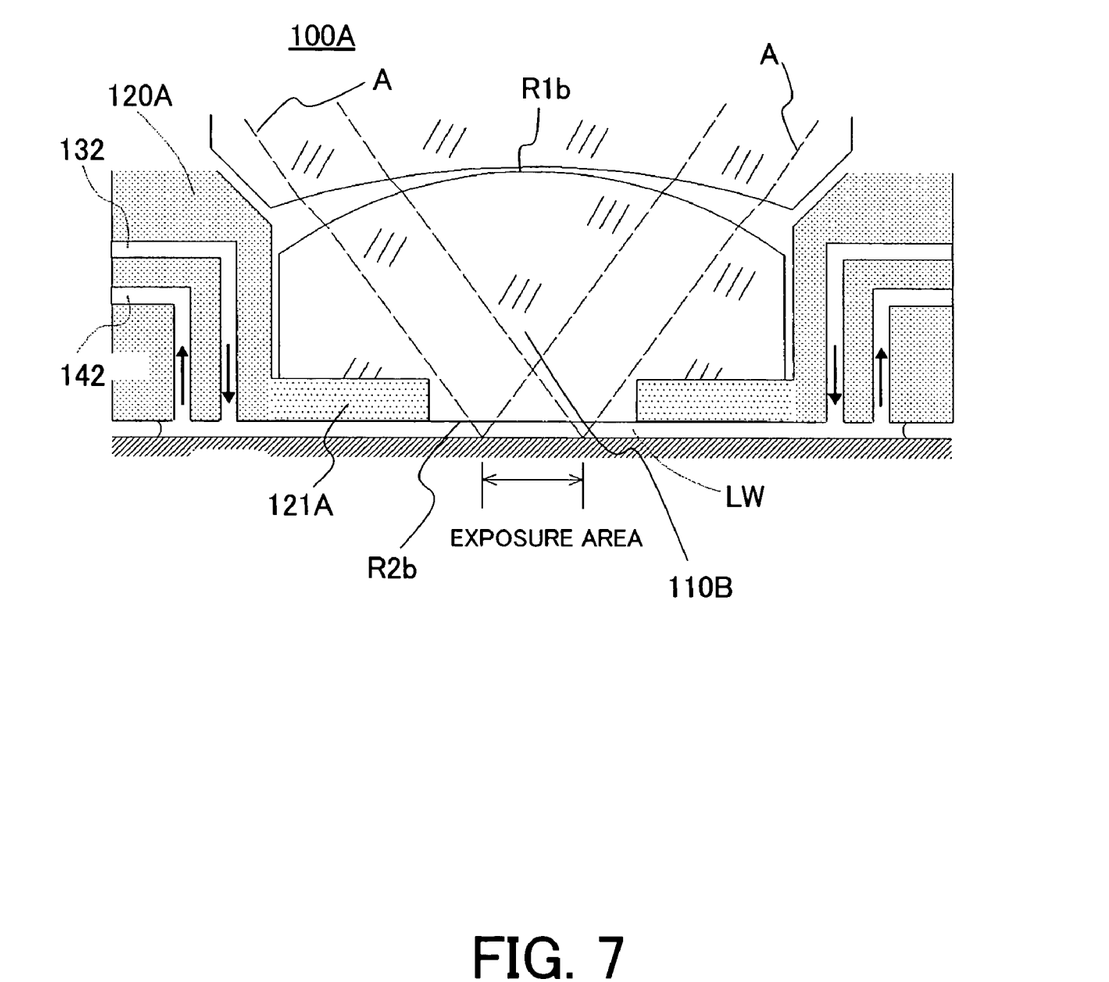
FIG. 7 is a schematic sectional view of a projection optical system of another embodiment used for the immersion type exposure apparatus shown in FIG. 1.
Figure 8A:
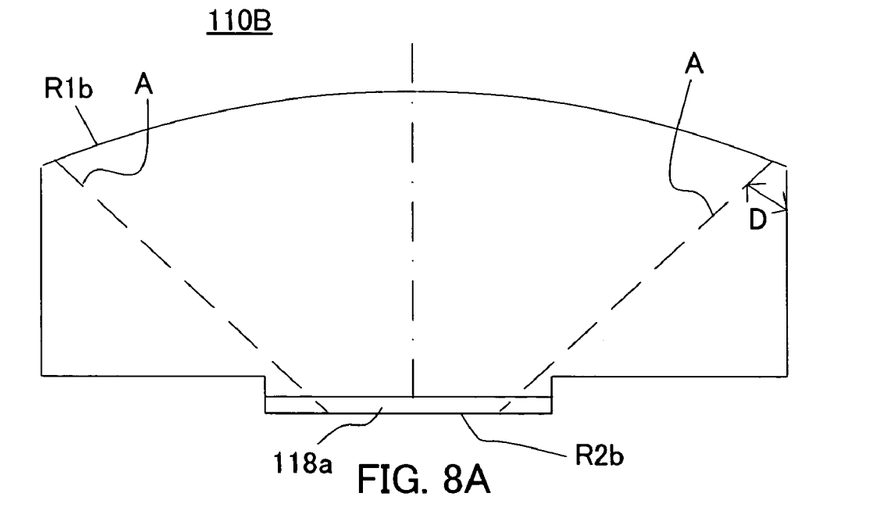
FIG. 8 is a schematic sectional view of a final lens used for the projection optical system shown in FIG. 7.
Figure 8B:
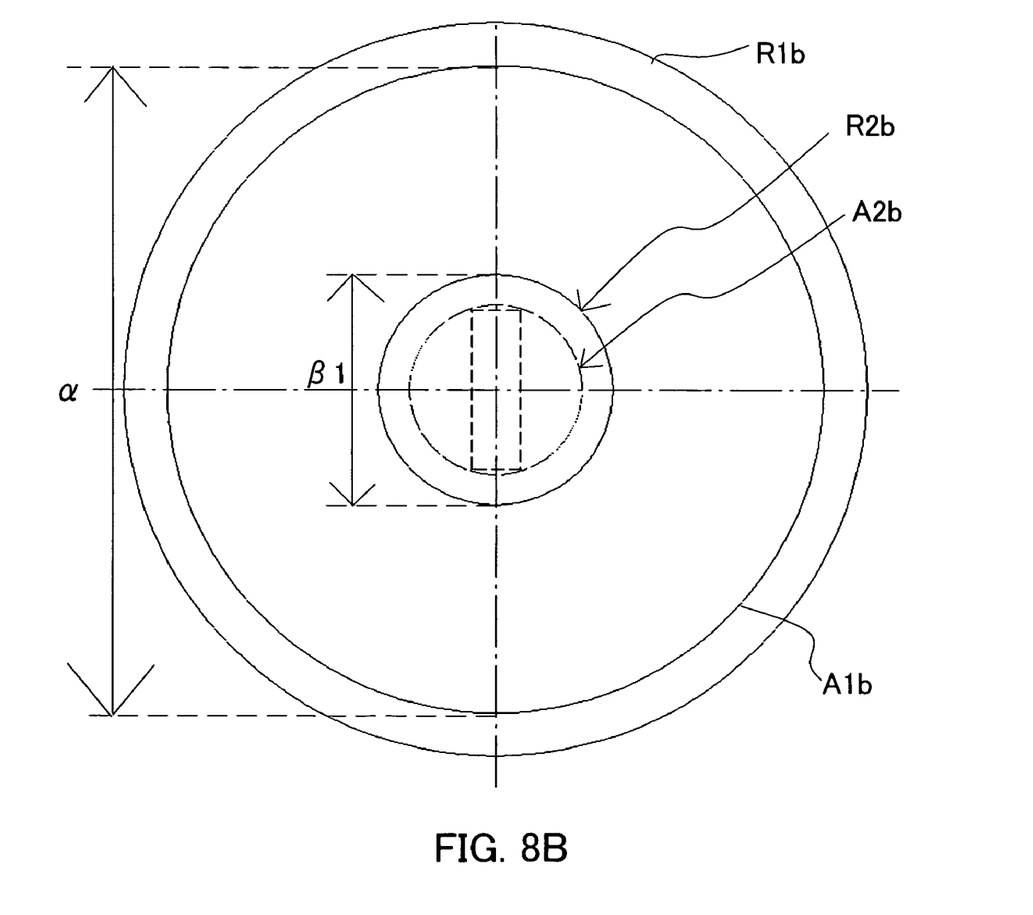

Referring to FIG. 7, a description will be given a projection optical system 100A that is another embodiment of the projection optical system 100. Here, FIG. 7 is a sectional view of the projection optical system 100A that is another embodiment of the projection optical system 100. FIG. 8A is a sectional view of the final lens 110B of the projection optical system 100A, and FIG. 8B is a plane view of the final lens 110B of the projection optical system 100A.

The projection optical system 100A has a structure similar to the projection optical system 100 but is different in the final lens 110B and the lens barrel 120A. The projection optical system 100A includes the final lens 110B and the lens barrel 120A.

The final lens 110B has, as shown in FIGS. 7 and 8, a sectional shape of T letterform. The final lens 110B is formed to an external shape that has the interval D of 2 mm or more from the effective diameter A because forming the shape that the maximum NA light of the incidence light of the projection optical system 110A is not blocked as shown in FIG. 8A. As above-mentioned, if the interval D is 2 mm or less, the distortion is given to the final lens 110B when the lens is processed, and the distortion is cause of damaging the birefringence and refractive index homogeneity etc. of light.

The final lens 110B reduces the contact area with the liquid LW because the second surface R2b is smaller than the conventional final lens. Therefore, the final lens 110B decreases impurities that begin to dissolve into the liquid LW, and can prevent the contamination of the liquid LW. As a result, the high-quality exposure can be achieved by preventing the deterioration and irregularity of transmittance. In this case, the outer diameter B1 of the second surface R2b is less than ½ of the effective diameter a of the first surface R1b. Thereby, the distance β½ of the retaining member 121A and the optical axis of the projection optical system 100 is less than ¼ of the outer diameter of the first surface R1b (¼ or less of the effective diameter A of the first surface R1b). Therefore, the contact area with the liquid LW is reduced to less than 25%, and impurities of 75% or more beginning to dissolved can be reduced substantially.

The final lens 110B has a protective layer 118a at the second surface R2b of the final lens 110B as well as the final lens 110. The final lens 110B decreases the impurities that begin to dissolve from the lens by installing the protective layer 118a, and prevents the contamination of the liquid LW. As a result, the high-quality exposure can be achieved by preventing the deterioration and irregularity of transmittance.

The lens barrel 120A protects, and retains the lens unit. The lens barrel 120A includes, as shown in FIG. 7, a retaining member 121A.

The retaining member 121A projects to the second surface R2b of the final lens 110B, and projects into the vicinity of the effective diameter A of the final lens 110B. In other words, the retaining member 121A is arranged at the inside from the incidence area of the light in the first surface R1b of the final lens 110A (inside from the effective diameter). Therefore, a contact area of the final lens 110B and the liquid LW is decreased. Thereby, the retaining member 121A decreases the impurities that begin to melt from the lens, and prevents the contamination of the liquid LW. As a result, the high-quality exposure can be achieved by preventing the deterioration and irregularity of transmittance.

Hereinafter, a description will be given of an immersion exposure method executed in the immersion type exposure apparatus 1 of the instant embodiment.

First, the liquid LW is supplied on the object 50 via the liquid supply nozzle 132 by, for instance, almost constant flow rate in the state that the object 50 is stopped or moved, and an enough liquid film is formed by adhering the liquid LW to the upper surface of the liquid supply nozzle 132 and the upper surface of the object 50.

Next, when the liquid LW is filled, the exposure is started. In exposure, light is emitted from the light source unit 12, e.g., Koehler-illuminates the reticle 20 via the illumination optical system 14. Light that passes through the reticle 20 and reflects the reticle pattern is imaged onto the object 50 by the projection optical system 100. The liquid supply nozzle 132 keeps supplying the liquid LW during exposure. Therefore, the liquid recovery nozzle 142 recovers the liquid LW that flows to the outside, and the space between the object 50 and the final lens 110 is stably filled by the liquid LW.

When the exposure ends, the supply of the liquid LW from the supply nozzle 132 is stopped, and the liquid recover nozzle 142 recovers the liquid LW that remains on the object 50.

The above-mentioned sequence of supply and recovery of the liquid LW may execute each exposure shot area (each one transfer of the reticle image), and may execute all or a part of exposure shot area on the object as one unit. In the latter case, when the object step-moves between the exposure shot areas, the liquid LW may be supplied and recovered, and when the step-moves, the supply and recovery of the liquid LW is stopped.

Figure 9:
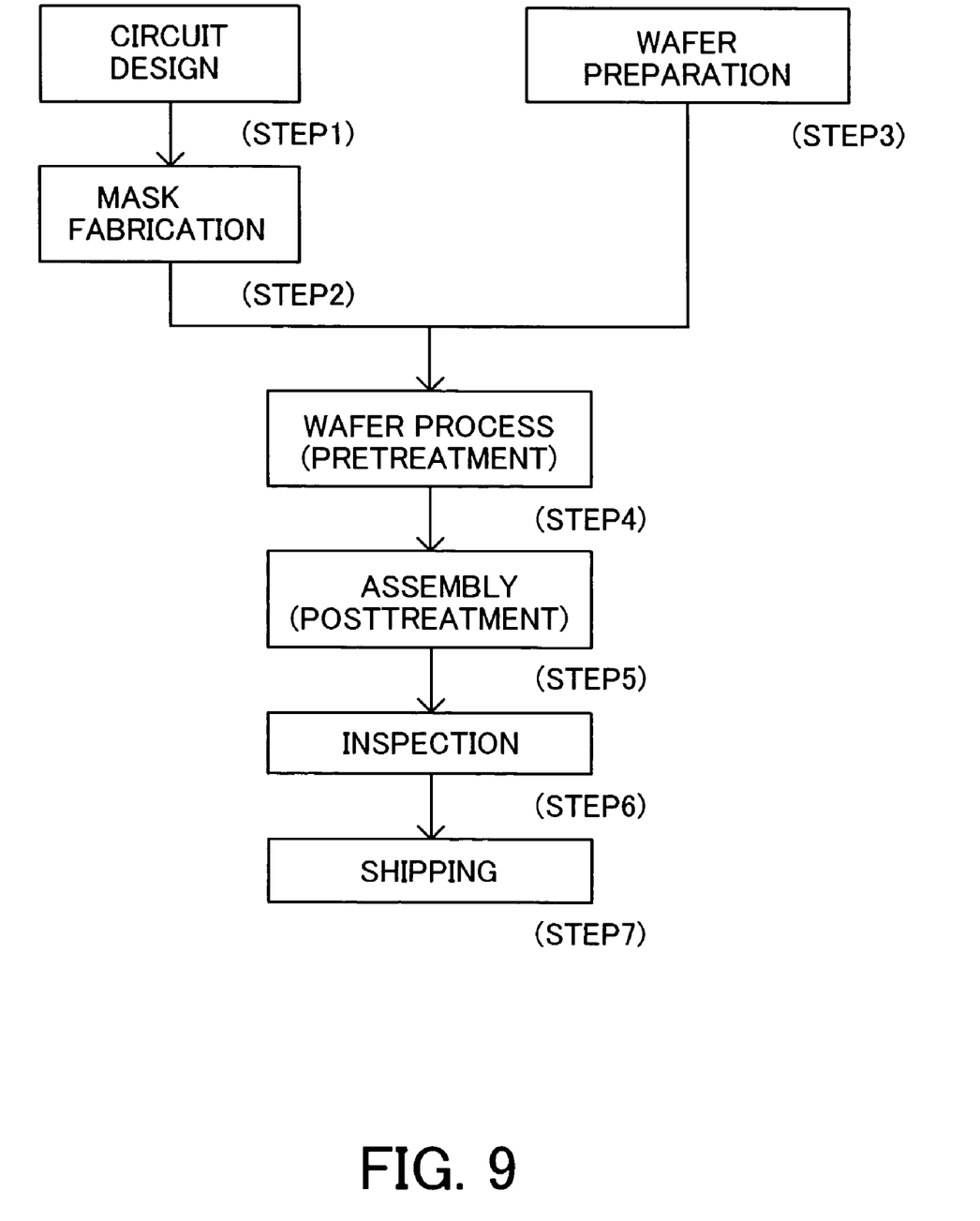
FIG. 9 is a flowchart for explaining how to fabricate devices (such as semiconductor chips such as ICs, LCDs, CCDs, and the like)
Figure 10:
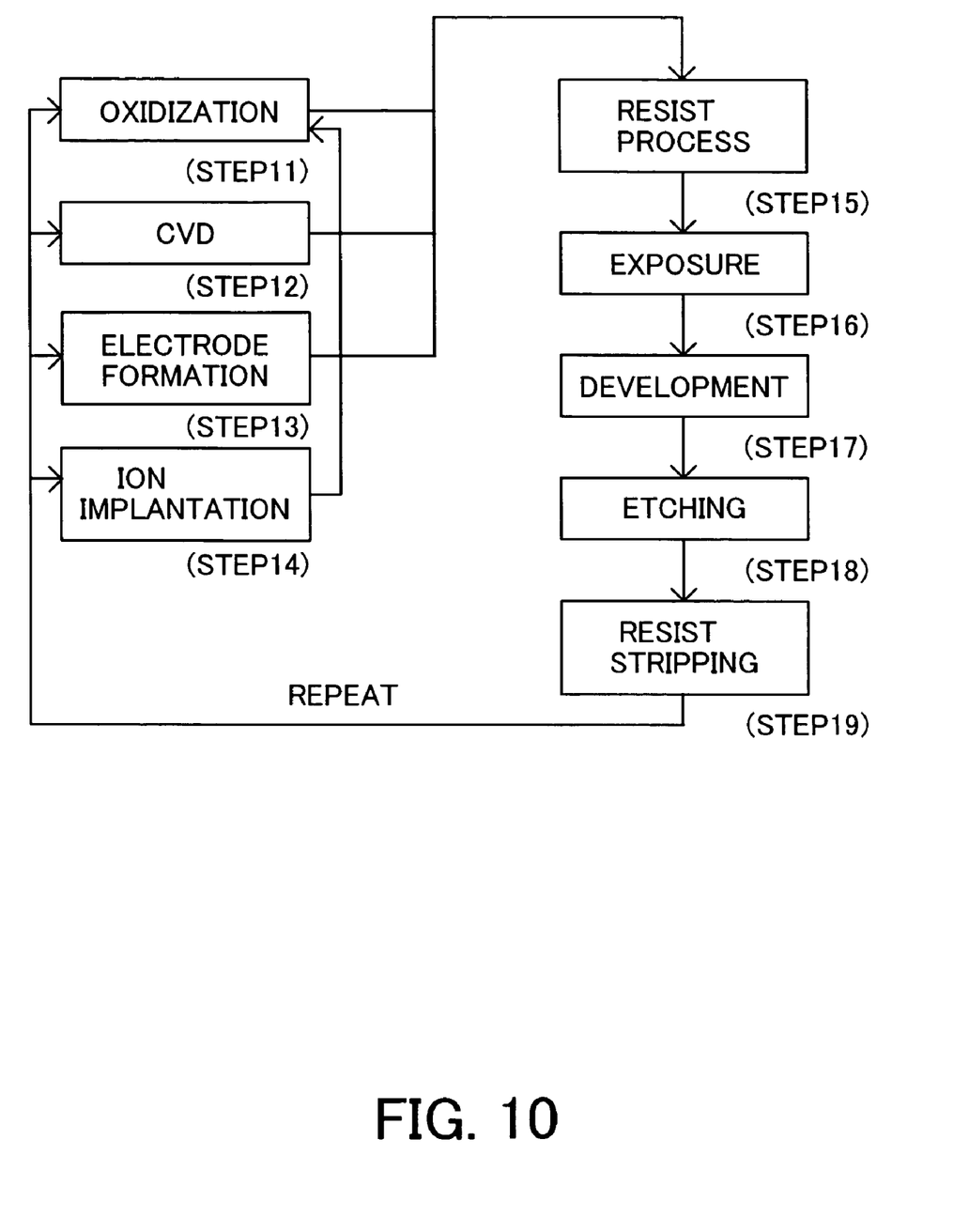
FIG. 10 is a detail flowchart of a wafer process in Step 4 of FIG. 9.

Referring now to FIGS. 9 and 10, a description will be given of an embodiment of a device fabrication method using the above immersion type mentioned exposure apparatus 1. FIG. 9 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the immersion type exposure apparatus 1 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Applications No. 2004-96429, filed on Mar. 29, 2004, which is hereby incorporated by reference herein in its entirety as if fully set forth herein.

What is claimed is:

1. An exposure apparatus comprising:
   an illumination optical system for illuminating a reticle with light from a light source; and
   a projection optical system for projecting a pattern of the reticle onto an object to be exposed, said projection optical system including a lens closest to the object, and a lens barrel for holding the lens,
   wherein said exposure apparatus exposes the object via a liquid that is filled in a space between the lens and the object, and
   wherein the lens includes:
   a convex surface on a reticle side;
   a first plane that contacts the liquid and is formed in the middle of the lens at an object side; and
   a second plane that is held by a retainer of the lens barrel, formed at the edge of the lens at the object side, and parallel to the first plane,
   the first plane being closer to the object than the second plane, and smaller than an effective area of the convex surface.

2. An exposure apparatus according to claim 1, wherein the first plane has an area ¼ or less of the effective area.

3. An exposure apparatus according to claim 1, wherein an outer diameter of the first plane is smaller than an effective diameter of the convex surface.

4. An exposure apparatus according to claim 3, wherein said outer diameter of the first plane is ½ or less of the effective diameter of the convex surface.

5. An exposure apparatus according to claim 1, wherein said lens includes a protective layer for preventing a contact between the lens and the liquid.

6. An exposure apparatus according to claim 1, wherein the first plane has a circular shape.

7. An exposure apparatus according to claim 1, wherein the first plane has a rectangular shape.

8. A device fabrication method comprising the steps of:
   exposing an object using an exposure apparatus; and
   performing a development process for the object exposed,
   wherein said exposure apparatus includes, a projection optical system for projecting a pattern of the reticle onto an object to be exposed, said projection optical system including a lens closest to the object, and a lens barrel for holding the lens,
   wherein said exposure apparatus exposes the object via a liquid that is filled in a space between the lens and the object, and
   wherein the lens includes:
   a convex surface on a reticle side;
   a first plane that contacts the liquid and is formed in the middle of the lens at an object side; and
   a second plane that is held by a retainer of the lens barrel, formed at the edge of the lens at the object side, and parallel to the first plane,
   the first plane being closer to the object than the second plane, and smaller than an effective area of the convex surface.

\* \* \* \* \*